United States Patent [19]
Yang et al.

[11] Patent Number: 6,090,725
[45] Date of Patent: Jul. 18, 2000

[54] METHOD FOR PREVENTING BUBBLE DEFECTS IN BPSG FILM

[75] Inventors: Yi-Chuan Yang, Hsin Chuang; Ching-Shun Lin; Mike W. J Sue, both of Tainan; Chih-Ta Wu, Hsinchu, all of Taiwan

[73] Assignee: Mosel Vitelic Inc., Hsinchu, Taiwan

[21] Appl. No.: 09/385,382

[22] Filed: Aug. 30, 1999

[51] Int. Cl.$^7$ .................................................. H01L 21/302
[52] U.S. Cl. .......................... 438/784; 438/783; 438/624
[58] Field of Search ...................................... 438/783, 784, 438/624, 761, 763

[56] References Cited

U.S. PATENT DOCUMENTS

| | | | |
|---|---|---|---|
| 4,960,488 | 10/1990 | Law et al. ................................ | 156/643 |
| 5,314,845 | 5/1994 | Lee et al. ................................. | 437/238 |
| 5,354,387 | 10/1994 | Lee et al. ................................ | 148/33.3 |
| 5,814,377 | 9/1998 | Robles et al. ........................... | 427/579 |

*Primary Examiner*—John F. Niebling
*Assistant Examiner*—Alexander G. Ghyka
*Attorney, Agent, or Firm*—Gilberto M. Villacorta; Pepper Hamilton LLP

[57] ABSTRACT

A method for preventing bubble defects in borophosphosilicate glass (BPSG) film is provided. A wafer for depositing borophosphosilicate glass (BPSG) film is loaded in deposition chamber. After the wafer is properly positioned, the wafer is heated to a predetermined temperature. A process gas is introduced from the gas distribution system to the deposition chamber. A selected pressure of the deposition chamber is set and maintained throughout deposition process. After deposition of the BPSG film, the wafer is loaded out the chamber. Subsequently, helium gas is introduced to purge the liquid injection valve and delivery path. After pumping out the purge gas, the another wafer is then loaded in the chamber for depositing BPSG film.

21 Claims, 3 Drawing Sheets

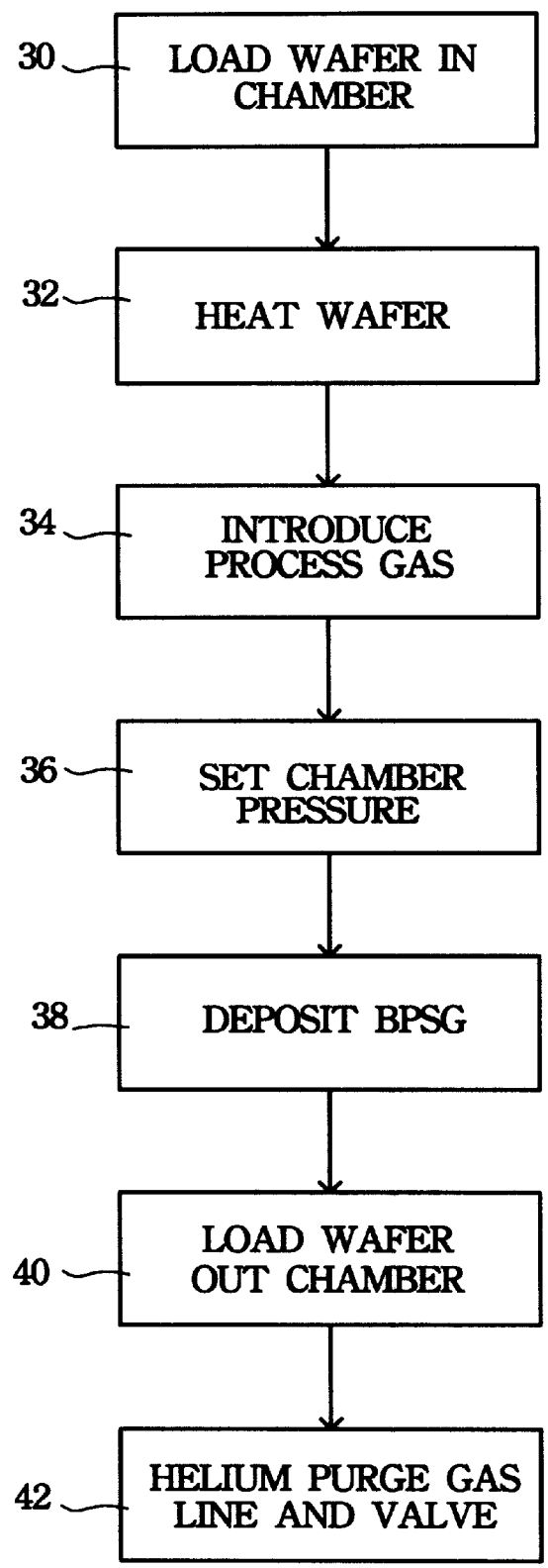
(FIG. 3)

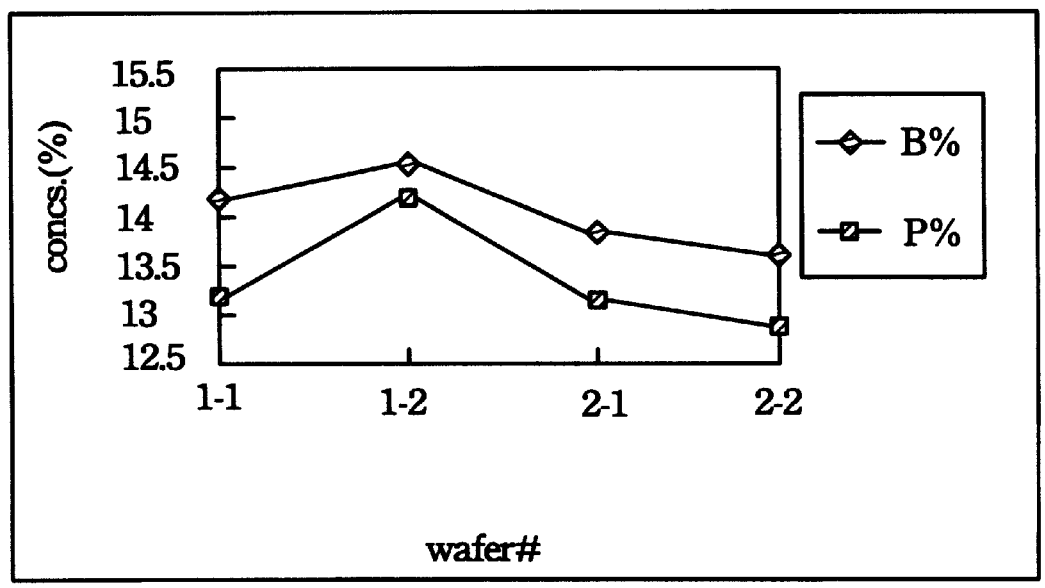
(FIG. 4)

METHOD FOR PREVENTING BUBBLE DEFECTS IN BPSG FILM

FIELD OF THE INVENTION

The present invention relates to the process of semiconductor wafers, more particularly, to a method that prevents bubble defects forming in a BPSG film after high temperature process.

BACKGROUND OF THE INVENTION

Recently, significant advances have been obtained to meet the need for the Ultra Large Scale Integrated (ULSI) circuits. Semiconductor integrated circuits currently being manufactured follow ultra high density design rules and circuits manufactured in the near future will follow even smaller design rules. Chip yield on the processed silicon wafer becomes an important topic when electronic devices are shrunk today. The operation voltage and power are decreased, thus, the tolerance of defect and error in device also been decreased significantly.

Chemical vapor deposition (CVD) for dielectrics is an importance process in the modern semiconductor process, because of good ability of step coverage. In generally, the dielectrics include silicon dioxide ($SiO_2$), silicon nitride ($Si_3N_4$), phosphosilicate glass (PSG), and borophosphosilicate glass (BPSG). BPSG often be used as pre-metal dielectric, which has good planarization characteristics after performing a thermal flow process. Therefore, BPSG is widely used as a pre-metal insulating layer in the manufacture of semiconductor devices.

A BPSG film is deposited generally by chemical vapor deposition (CVD) process. The BPSG film is formed by introducing a tetraethoxysilane (TEOS), a phosphorus containing source, a boron containing source into a processing chamber along with the oxygen containing source. An example of phosphorus containing source is tri-methyl-phosphate (TMPO). An example of boron containing source is tri-methyl-borate (TMB). TEOS, TMPO, and TMB are liquid in normal atmospheric that is a need to heat for increasing saturated vapor pressure. Helium gas is used as carrier gas for increasing the vapor partial pressure of liquid reactants.

Please refer to FIG. 1, which shows a liquid injection valve of a conventional chemical vapor deposition system, wherein a heater 12 is used to maintain the gas lines at selected temperature. The process liquid sources 14 are transferred to liquid injection valve 10 passing the liquid lines 16. The liquid sources are vaporized and delivered to a processing chamber 20 by helium carrier gas 18. The liquid injection valve provides greater control of the volume of reactant sources. However, the pore and dimension of pass line in the liquid injection valve are tiny. There are at least three valves between liquid lines and the processing chamber. When the deposition process is complete, residuals of the reactants always are remained in the valve system. The residuals of the reactants cause the concentrations of boron and phosphorus unstable at next deposition process. The Yield of BPSG film will be decreased.

Please refer to FIG. 2, which shows a cross-sectional view of a semiconductor wafer with BPSG film generating bubble defects after high temperature flow. A plurality of devices 24 is formed on the semiconductor substrate 22. A dielectric layer (not labeled) is then formed over the devices and substrate for isolation. Before metallization process, TEOS/O3, TMB, TMPO are reactants for depositing BPTEOS film 26 by atmospheric pressure chemical vapor deposition (APCVD) for planarizing topography. The thin dielectric layer (not labeled) is an interlayer of the BPTEOS film for protecting the active areas of devices.

As described above, there is a need to perform a thermal flow at 850 to 900° C. for increasing planarization of topography. Referring to FIG. 2, the BPTEOS film by conventional deposition process has unstable concentrations of boron and phosphorus. The phosphorus in the BPTEOS has good gettering moisture characteristic. It is easy to form bubble defects in BPTEOS film after thermal flow, especially containing high concentration of phosphorus. It is easy to form crystal defects in BPTEOS film after thermal flow, especially containing high concentration of boron.

Therefore, it is a need to disclose a method for avoiding the concentrations of boron and phosphorus unstable and preventing bubble defects in BPSG film.

SUMMARY OF THE INVENTION

As described above, after the BPSG film is deposited by a conventional deposition method, the boron and phosphorus containing reaction gases always remain residual in the delivery path of the system, which cause the concentrations of boron and phosphorus unstable. An object of the present invention is to provide a method using helium gas purge the delivery path of the system. The method of the present invention eliminates the residual of the boron and phosphorus containing process gases to increase yield of the BPSG film.

The present invention provides a method for preventing bubble defect in borophosphosilicate glass (BPSG) film. A wafer for depositing borophosphosilicate glass (BPSG) film is loaded in deposition chamber. After the wafer is properly positioned on the susceptor, the wafer and the susceptor are heated to a predetermined temperature for maintaining the wafer at process temperature. A process gas is then introduced from the gas distribution system to the deposition chamber. The process gas includes carrier gas and reactants. The reactants are liquid in room temperature of atmospheric pressure, which are converted to reactive gases and input to the chamber by liquid injection valve. A selected pressure of the deposition chamber is set and maintained throughout deposition process. Then the deposition process of the BPSG film is performed.

After deposition of the BPSG film, the wafer is loaded out the chamber. Subsequently, the chamber is cleaned by dry etching. Helium gas is introduced to purge the liquid injection valve and delivery path. After pumping out purge gas, the another wafer is then loaded in the chamber for depositing BPSG film. Thus, the present invention increases yield of the BPSG film, which keep the concentrations of boron and phosphorus stable. The bubble defects are avoided even through high temperature process.

BRIEF DESCRIPTION OF THE DRAWINGS

The present invention is illustrated by way of example and not limitation in the figures of the accompanying drawings.

FIG. 3 is a flowchart illustrating steps according to the method of the present invention for preventing bubble defects in BPSG film; and FIG. 4 is a diagram of curve of concentrations of boron and phosphorus in BPSG of the present invention.

DETAILED DESCRIPTION OF THE PRESENT INVENTION

Figure 1:
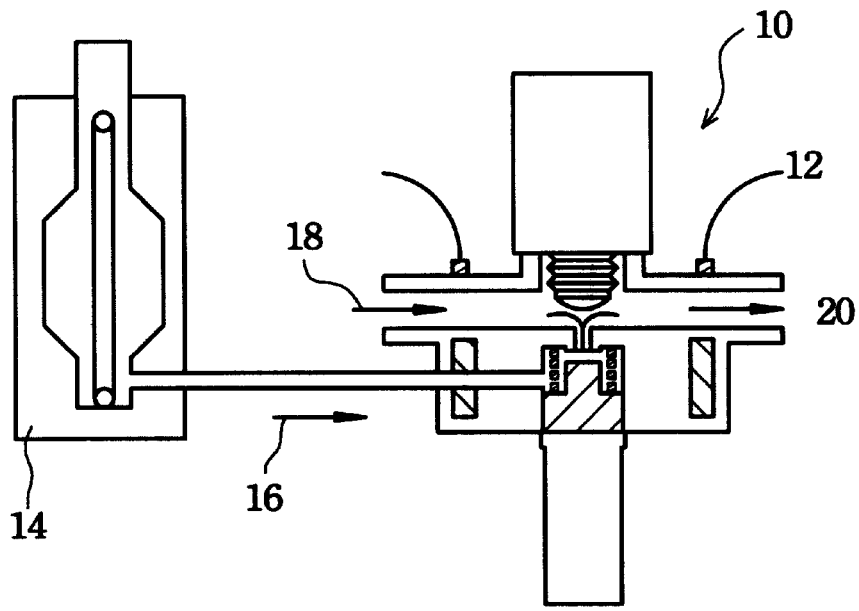
FIG. 1 is a liquid injection valve of a conventional chemical vapor deposition system.
Figure 2:
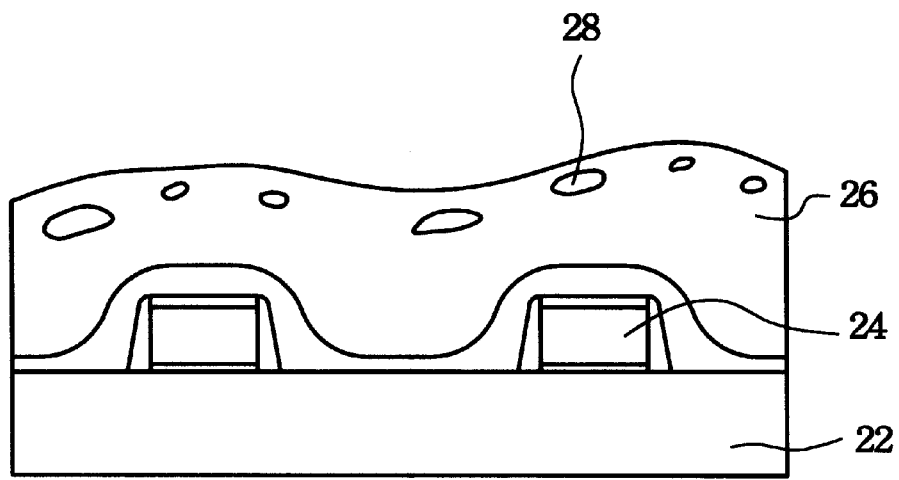
FIG. 2 is a cross-sectional view of a semiconductor wafer with BPSG film generating bubble defects after high temperature flow.

As described above, the concentrations of boron and phosphorus in BPSG film deposited by a conventional deposition method are unstable. After a high temperature flow, many bubble defects form in the BPSG film, which decreases yield of devices. The present invention provides a method for preventing bubble defects in BPSG film to improve the prior art of forming BPSG film.

The present invention is performed by P5000 system of chemical vapor deposition that is provided by Applied Materials, Inc. The P5000 system is a single wafer system. In a preferred embodiment, deposition of a BPSG film is performed by a sub-atmospheric chemical vapor deposition (SACVD). The SACVD process is a kind of low deposition rate of CVD process, which has good ability of gap fill.

Please refer to FIG. 3, which shows a flowchart illustrating steps according to the method of the present invention for preventing bubble defects in BPSG film. First, a wafer for depositing borophosphosilicate glass (BPSG) film is loaded in a deposition chamber (step 30). After the wafer is properly positioned on the susceptor, the wafer and the susceptor are heated to a predetermined temperature (step 32). The predetermined temperature is substantially between 400 to 480° C. A process gas is then introduced from the gas distribution system to the deposition chamber (step 34).

In a preferred embodiment, the process gas includes carrier gas and reactants. The reactants include a boron containing source, a phosphorus containing source, a silicon containing source, and an oxygen containing source which are introduced from a source distribution system and mixed together in gas mixing system. TEB (Tri-Ethyl-Borate) is preferable as a boron containing source. TEPO (Tri-Ethyl-Phosphate) is preferable as a phosphorus containing source. TEOS (Tetra-Ethyl-Ortho-Silicate) is preferable as a silicon containing source. An oxygen/ozone mixture is used as the oxygen containing source. The reactants as described above are illustrated of the present invention rather than limiting of the present invention. The other similar reactants will be appreciated to the present invention, such as TMB (Tri-Methyl-Borate) or TMPO (Tri-Methyl-Phosphate).

The TEB, TEPO, and TEOS are all liquid sources in room temperature of atmospheric pressure, which are vaporized by a liquid injection system. A liquid injection valve in the liquid injection system provides greater control of the volume of reactant gases introduced into the gas mixing system at selected rate of flow. TEB is introduced preferably at a rate of between about 100 to 110 sccm. TEPO is introduced preferably at a rate of between about 45 to 55 sccm. TEOS is introduced preferably at a rate of between about 500 to 550 sccm. The vaporized TEB, TEPO, TEOS gases and oxygen containing sources are then mixed in the gas mixing system with a helium carrier gas. The helium gas is introduced preferably at a rate of between about 5000 to 6000 sccm. The helium carrier gas delivers the mixing reaction gas to the gas distribution system then into the deposition processing chamber. The total rate of flow of the mixing process gas into the deposition chamber is between about 11000 to 12000 sccm.

A selected pressure of the deposition chamber is set and maintained throughout deposition process by throttle valve in introduction of the process gas (step 36). The selected pressure within the chamber is at between about 200 torr. The deposition process of the BPSG film is performed with a thickness of about 7000 to 11000 Å.

After deposition of the BPSG film is performed, the wafer is loaded out the processing chamber (step 40). The deposition process also forms BPSG product on the chamber wall, for avoiding particles decreasing yield, there is a need to perform a dry clean. The processing chamber is cleaned by plasma dry etching to eliminate the product on the chamber wall. The plasma source includes $C_2F_6$ and $NF_3$. Simultaneously, the helium gas is introduced again to purge the gas distribution and liquid injection system (step 42). The purge process of the helium gas is used to eliminate residuals in the delivery path and liquid injection valve. The residuals include a boron containing source and a phosphorus containing source, which cause the concentrations of boron and phosphorus of next deposition unstable. The purge helium gas has a selected rate of between about 500 sccm. The time of purge process is about 30 seconds. The purge process makes the concentrations of boron and phosphorus of a wafer of next deposition process stable without contaminate. Subsequently, the purge gas is exhausted out the processing chamber by an exhaust system. After pumping out the purge gas, the another wafer is then loaded in the chamber for depositing BPSG film.

After deposition of the BPSG film, the wafer is transferred to a furnace where film is flowed in a nitrogen gas or other inert gas environment. The flow process is used for planarization of the wafer surface. The flow temperature is between about 850 to 900° C., and flow time is about 15 min. In a preferred embodiment, the concentrations of boron and phosphorus in BPSG film formed by the present invention are about 16 wt % and 14 wt %, respectively. The BPSG film has high concentrations of boron and phosphorus comparing to a standard BPSG film formed conventionally. However, the BPSG film formed by the present invention will not generate bubble defects after a high temperature process.

Please referring to FIG. 4, that shows a diagram of curve of concentrations of boron and phosphorus in BPSG of the present invention. A wafer 1-1 is a first wafer and wafer 1-2 is a second wafer deposited by the same deposition system without performing a purge step. In the diagram of FIG. 4, the concentrations of boron and phosphorus of wafer 1-2 are both increased obviously than wafer 1-1. It shows that the concentrations of boron and phosphorus will unstable without performing a purge step after each deposition process. The residuals of the reactant cause the concentrations of boron and phosphorus of subsequent deposition process increase incessantly, especially the concentration of phosphorus. The unstable concentration of BPSG film forms bubble defects or crystals after high temperature process.

Still referring to FIG. 4, a wafer 2-1 is a first wafer and wafer 2-2 is a second wafer deposited by the same deposition system with performing a purge step. It shows that the concentrations of boron and phosphorus are stable with performing a purge step after each deposition process. The concentrations of boron and phosphorus of subsequent deposition process will not increase incessantly, which prevents the defects in the BPSG film.

The present invention discloses a method for preventing bubble defects in BPSG film. The conventional deposition process will cause residuals of boron and phosphorus containing reactants remain in the delivery path and the liquid injection system, which influences the concentration of the BPSG film of next deposition. The method of the present invention includes a step of purge the deposition system by helium gas, especially the tiny lines in the deposition system. Thus, the present invention increases yield of the BPSG film, which keep the concentrations of boron and phosphorus stable. The bubble defects are avoided even through high temperature process.

As is understood by a person that skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method for preventing bubble defects in phosphorus containing dielectrics, said method comprising the steps of:

loading a wafer in a chemical vapor deposition (CVD) chamber:

heating said wafer to a predetermined temperature to maintain the wafer at said temperature;

introducing a process gas into said chamber;

setting a process pressure of said chamber;

performing a chemical vapor deposition process to form a phosphorus containing dielectric film on said wafer surface;

loading said deposited wafer out said chamber; and introducing helium gas into said chamber passing a liquid injection valve and delivery path for purging said injection valve and delivery path, which eliminates said process gas residual.

2. The method according to claim 1, wherein said chemical vapor deposition is a sub-atmospheric chemical vapor deposition (SACVD).

3. The method according to claim 1, wherein said process pressure of said chamber is about 200 torr.

4. The method according to claim 1, wherein said predetermined temperature is about 400 to 480° C.

5. The method according to claim 1, wherein said phosphorus containing dielectric film is made of phosphorus silicate glass (PSG).

6. The method according to claim 5, wherein said process gas includes tri-ethyl-phosphate (TEPO), tetra-ethyl-ortho-silicate (TEOS), and ozone ($O_3$).

7. The method according to claim 5, wherein a concentration of phosphorus of said PSG film is about 14%.

8. The method according to claim 1, wherein said phosphorus containing dielectric film is made of borophosphosilicate glass (BPSG).

9. The method according to claim 8, wherein said process gas includes tri-ethyl-borate (TEB), tri-ethyl-phosphate (TEPO), tetra-ethyl-ortho-silicate (TEOS), and ozone ($O_3$).

10. The method according to claim 8, wherein a concentration of phosphorus of said BPSG film is about 14%.

11. The method according to claim 8, wherein a concentration of boron of said BPSG film is about 16%.

12. The method according to claim 1, wherein said helium gas has a rate between about 500 sccm.

13. The method according to claim 1, wherein said helium gas is introduced at a time of about 30 seconds.

14. A method for preventing bubble defects in borophosphosilicate glass (BPSG) film, said method comprising the steps of:

loading a wafer in a sub-atmospheric chemical vapor deposition (SACVD) chamber:

heating said wafer to a predetermined temperature to maintain the wafer at said temperature;

introducing a process gas into said chamber;

setting a process pressure of said chamber;

performing a chemical vapor deposition process to form a BPSG dielectric film on said wafer surface;

loading said deposited wafer out said chamber; and introducing helium gas into said chamber passing a liquid injection valve and delivery path for purging said injection valve and delivery path, which eliminates said process gas residual.

15. The method according to claim 14, wherein said process pressure of said chamber is about 200 torr.

16. The method according to claim 14, wherein said predetermined temperature is about 400 to 480° C.

17. The method according to claim 14, wherein said process gas includes tri-ethyl-borate (TEB), tri-ethyl-phosphate (TEPO), tetra-ethyl-ortho-silicate (TEOS), and ozone ($O_3$).

18. The method according to claim 14, wherein a concentration of phosphorus of said BPSG film is about 14%.

19. The method according to claim 14, wherein a concentration of boron of said BPSG film is about 16%.

20. The method according to claim 14, wherein said helium gas has a rate between about 500 sccm.

21. The method according to claim 14, wherein said helium gas is introduced at a time of about 30 seconds.

* * * * *